(12) United States Patent
Muller et al.

(10) Patent No.: US 6,432,829 B2
(45) Date of Patent: Aug. 13, 2002

(54) PROCESS FOR MAKING PLANARIZED SILICON FIN DEVICE

(75) Inventors: K. Paul L. Muller, Wappingers Falls, NY (US); Edward J. Nowak, Essex Junction, VT (US); Hon-Sum P. Wong, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/801,473

(22) Filed: Mar. 8, 2001

Related U.S. Application Data

(62) Division of application No. 09/458,531, filed on Dec. 9, 1999, now Pat. No. 6,252,284.

(51) Int. Cl.[7] .............................................. H01L 21/302
(52) U.S. Cl. ...................... 438/694; 438/720; 438/721
(58) Field of Search ................................. 438/691, 692, 438/694, 706, 710, 719, 720, 721, 722

(56) References Cited

U.S. PATENT DOCUMENTS

| | | | |
|---|---|---|---|
| 4,855,247 A | 8/1989 | Ma et al. | 148/DIG. 105 |
| 4,996,574 A | 2/1991 | Shirasaki | 257/347 |
| 5,023,679 A | 6/1991 | Shibata | 357/23.4 |
| 5,256,894 A | 10/1993 | Shino | 257/388 |
| 5,675,164 A | 10/1997 | Brunner et al. | 257/331 |
| 5,714,786 A | 2/1998 | Gonzalez et al. | 257/366 |
| 5,726,479 A | 3/1998 | Matsumoto et al. | 257/412 |
| 5,767,558 A | 6/1998 | Lo et al. | 257/412 |
| 5,789,289 A * | 8/1998 | Jeng | 438/253 |
| 5,903,430 A * | 5/1999 | Takaishi | 257/303 |
| 6,013,569 A | 1/2000 | Lur et al. | 438/595 |
| 6,015,997 A | 1/2000 | Hu et al. | 257/412 |
| 6,174,768 B1 * | 1/2001 | Takaishi | 438/253 |
| 6,177,699 B1 * | 1/2001 | Perng et al. | 257/303 |
| 6,236,080 B1 * | 5/2001 | Lou | 257/306 |

FOREIGN PATENT DOCUMENTS

| | | |
|---|---|---|
| JP | 404321271 | 11/1992 |
| JP | 04150682 | 12/1993 |
| JP | 496077478 | 3/1994 |
| JP | 404002168 | 8/1994 |
| JP | 406236994 | 8/1994 |

* cited by examiner

*Primary Examiner*—Benjamin L. Utech
*Assistant Examiner*—Kin-Chan Chen
(74) *Attorney, Agent, or Firm*—Ratner & Prestia; H. Daniel Schnurmann

(57) ABSTRACT

An improved fin device used as the body of a field effect transistor ("FET") and an improved process of making the fin device. The fin device allows for the fabrication of very small dimensioned metal-oxide semiconductor ("MOS") FETs in the size range of micrometers to nanometers, while avoiding the typical short channel effects often associated with MOSFETs of these dimensions. Accordingly, higher density MOSFETs may be fabricated such that more devices may be placed on a single semiconductor wafer. The process of making the fin device results in an improved fully planarized device.

19 Claims, 9 Drawing Sheets

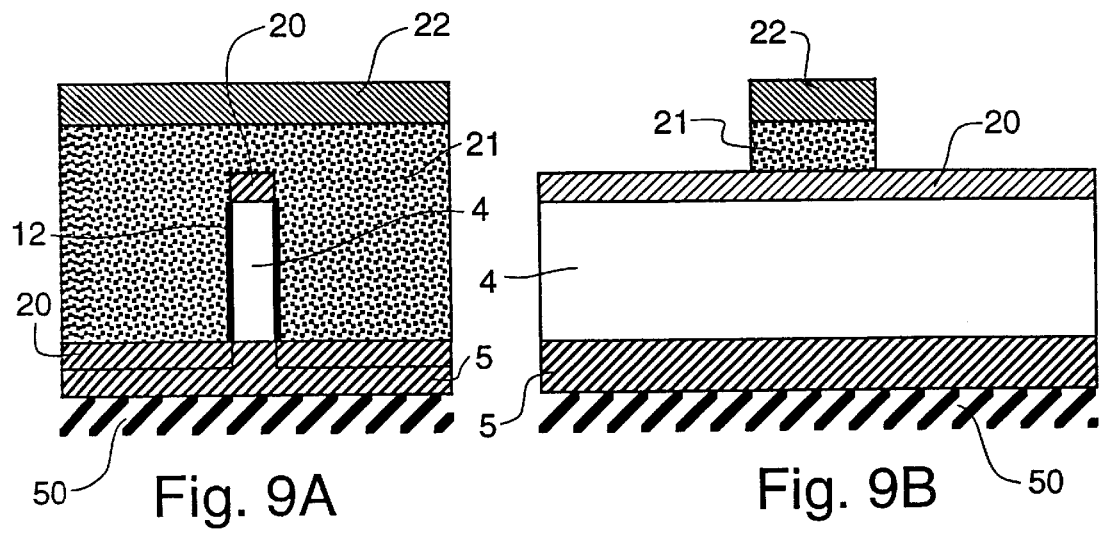
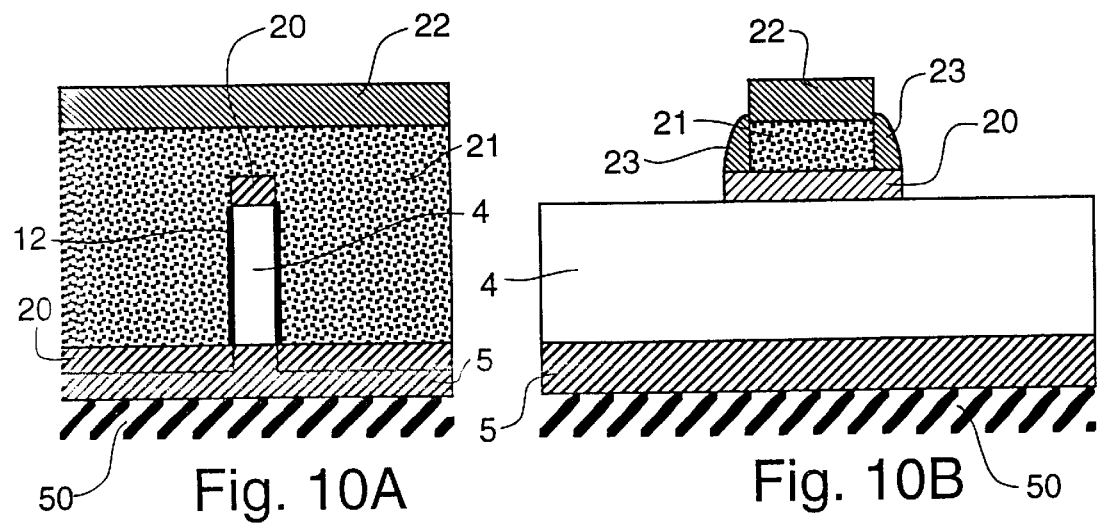

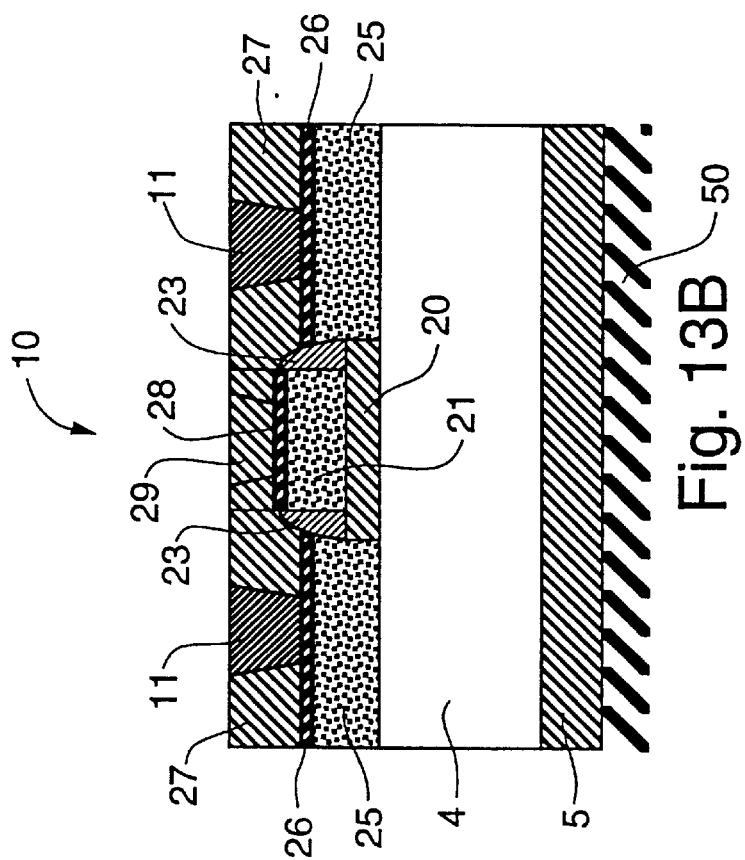
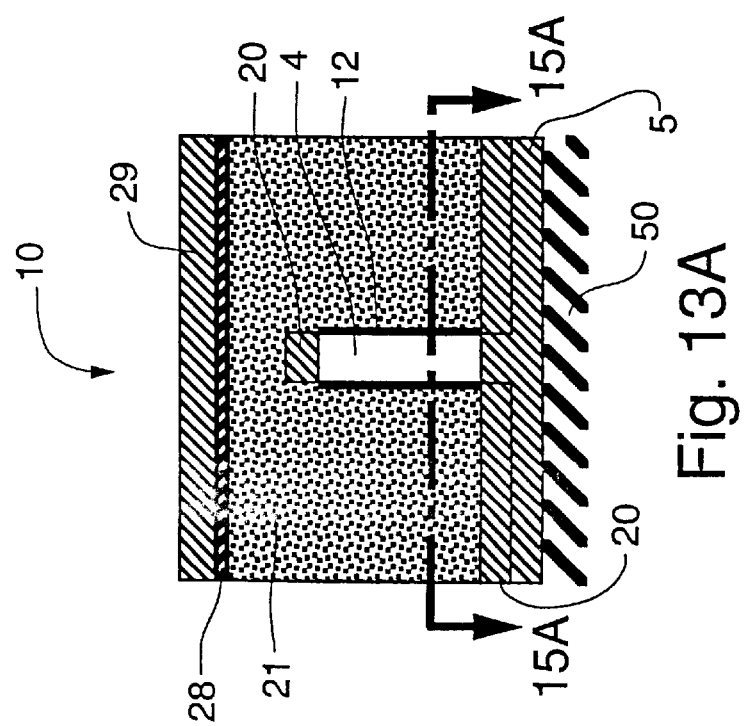

Fig. 15B
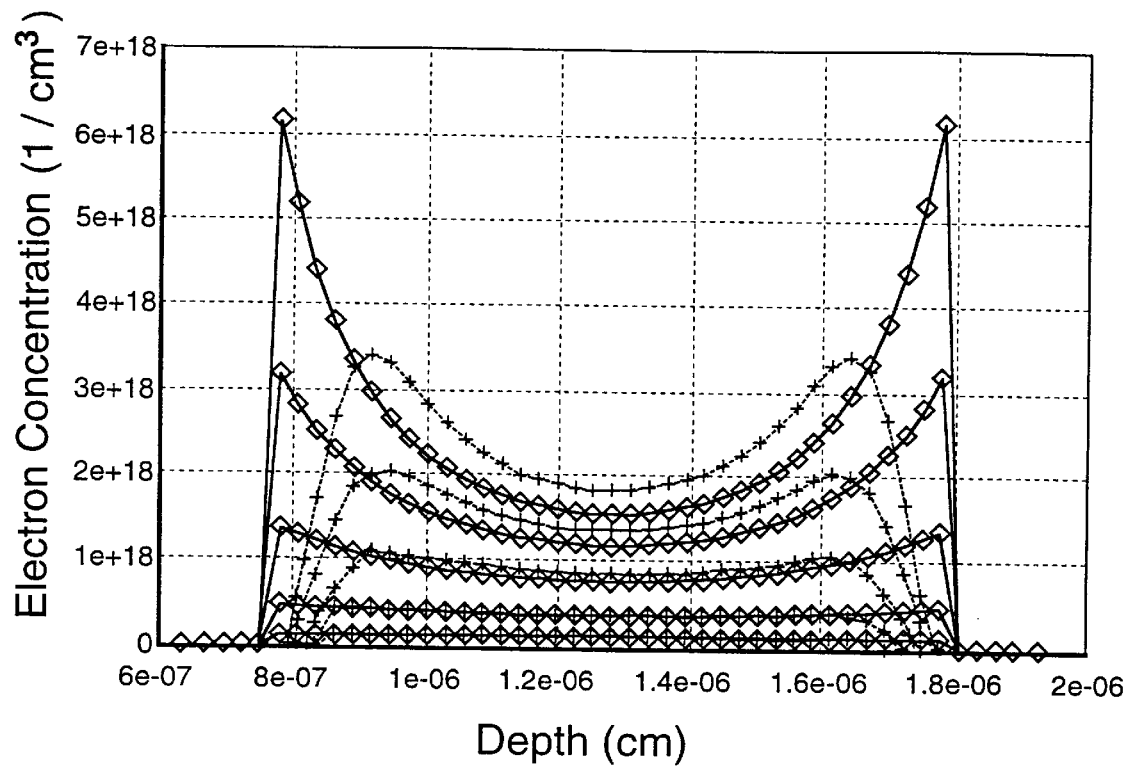
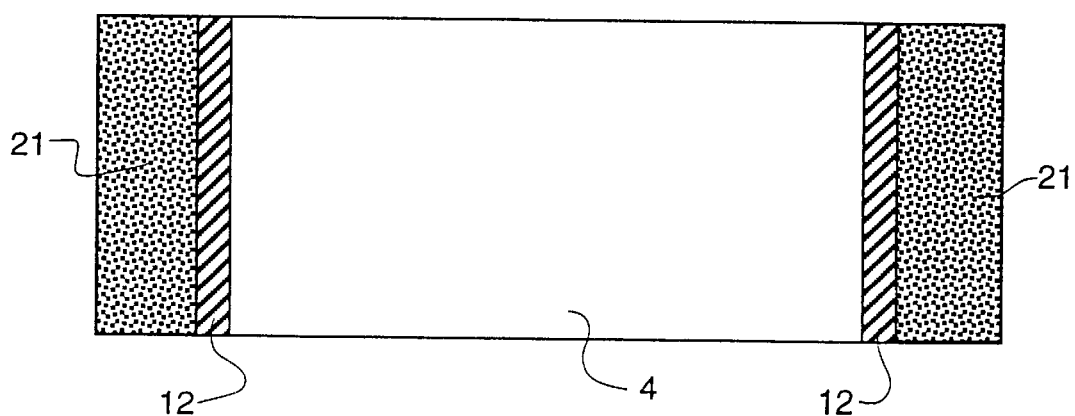
Fig. 15A

PROCESS FOR MAKING PLANARIZED SILICON FIN DEVICE

This application is a divisional of U.S. patent application Ser. No. 09/458,531, filed on Dec. 9, 1999, now U.S. Pat. No. 6,252,284.

The present invention generally relates to field effect transistors (FETs). More particularly, this invention relates to very small dimensioned metal-oxide semiconductor (MOS) FETs in the size range of micrometers (one micrometer or micron, $\mu m$, is $10^{-6}$ meters) to nanometers (one nanometer, nm, is $10^{-9}$ meters). Fabricated to allow for a higher density of devices on a semiconductor wafer, small MOSFETs may experience certain deleterious performance due to their size. One such problem is short channel effects caused by the limited separation of the source and drain. The inventive fin device and process of making the device alleviate short channel effects associated with MOSFETs having dimensions of micrometers or less.

BACKGROUND OF THE INVENTION

Since 1960 when integrated circuits ("ICs") were first created and fabricated, the number and density of the devices being formed on IC substrates has increased tremendously. Indeed, the very large scale integration ("VLSI") devices, having more than 100,000 devices on a chip, are generally considered old technology. The fabrication of ICs having hundreds of millions of devices on a chip is standard in the market today. The development of ICs with billions of devices on each chip is under current development. Therefore, the current description of IC fabrication is ultra large scale integration ("ULSI").

As part of the increase in the number of devices formed on an IC substrate and the concurrent increase in density of the devices, the dimensions of the devices have dropped significantly. In particular, the dimensions of gate thicknesses and channel separation of source and drain elements has continually reduced such that today, micrometer and nanometer separations of the source, drain, and gate are required. Although devices have been steadily reducing in size, the performance of the devices must be maintained or improved. In addition to performance characteristics, performance reliability, and durability of the device, the manufacturing reliability and cost are always critical issues.

Several associated problems arise with the miniaturization of devices, including short channel effects, punch-through, and leakage current. These problems affect both the performance of the device and the manufacturing process. Short channel effects are often observed when the width of the FET channel is less than 0.5 to 1.0 $\mu m$. The impact of short channel effects on device performance is seen in the reduction in the device threshold voltage and the increase of sub-threshold current.

More particularly, as the channel length becomes smaller, the source and drain depletion regions may expand towards each other. The depletion regions may essentially occupy the entire channel area between the source and drain. As a result of this effective occupation of the channel area by the source and drain, the channel is in part depleted and the gate charge necessary to alter the source and drain current flow is reduced.

One method for reducing or eliminating short channel effects is to reduce the thickness of the gate oxides adjacent to the source and drain. Not only will thin gate oxides reduce short channel effects, but they also allow for higher drive currents. One result is faster devices. As can be expected, however, there are significant problems associated with fabricating thin oxides, including manufacturing reproducibility and the uniformity and control of the oxide growth rate during the fabrication process.

Attempts to resolve the short channel effects and other problems associated with ULSI devices have been made and are continuing. One such attempt, described by Hisamoto et al. in "A Folded-Channel MOSFET for Deep-Sub-Tenth Micron Era," page 1032, Technical Digest of the 1998 International Electron Devices Meeting, teaches a quasi-planar vertical double-gate MOSFET having a gate length down to 20 nm. The features noted by Hisamoto et al. include a vertical ultra-thin silicon fin; two gates self-aligned with the source and drain; a raised source and drain to reduce parasitic resistance; and a quasi-planar structure. The Hisamoto et al. device appears to be limited to a channel of 20 nm, however, and does not appear to be suited for use in a planarized configuration. Moreover, the fabrication process shown by Hisamoto et al. does not appear to use conventional lithography and spacer techniques.

Another device, disclosed in U.S. Pat. No. 5,675,164 issued to Brunner et al. and assigned to the same applicant as this application, describes a high-performance multi-mesa FET. The FET includes mesa structures in a conduction region, favoring corner conduction, together with lightly doped mesa structures and mid-gap gate material also favoring operation in a fully depleted mode. Although teaching a high performance FET, the Brunner et al. disclosure specifically notes that silicon on insulator ("SOI") structures have certain disadvantages making their use impractical for the multi-mesa FETs.

The metal-insulator-semiconductor ("MIS") transistor described in U.S. Pat. No. 4,996,574 issued to Shirasaki for a MIS transistor structure for increasing conductance between source and drain regions has as a primary object to substantially increase the conductance between the source and drain regions while also decreasing the size of the device. As provided in Shirasaki, conventional MOSFET devices using a SOI structure are limited from increasing total current flow (e.g., performance) by the cross sectional area of the channel. According to Shirasaki, to increase the current flow, the channel area must also be increased thereby increasing the overall dimension of the device.

Finally, the abstract to Japanese Patent No. 5,343,679 issued to Daisuke et al., for a semiconductor device and manufacturing method thereof, shows and describes a MOS transistor device that uses different impurities imbedded into the device substrate from the source and drain impurities to enhance the transistor performance characteristics. Although apparently using a vertical fin configuration, the device shown does not result in a planarized device nor does it appear to use standard lithography or spacer techniques in the fabrication of the device.

Accordingly, there remains a need for MOSFETs, of dimensions in the range of micrometers to nanometers, that are capable of using an SOI structure that may be planarized, and that reduce or eliminate the problems of leakage, punch-through, and short channel effects. In addition, there remains a need for, and it would be desirable to have, a reliable fabrication process using conventional lithography and spacer process techniques to manufacture such an SOI device that may be planarized.

To meet these and other needs and to overcome the shortcomings of the prior art, it is an object of the present invention to provide a fin device that is in the size range of a micron or less. Another object is to provide a device that is not restricted by performance limitations of leakage, punch-through, and short channel effects typically associated with FETs having sub-micron dimensions. Still another object is to provide a process of making the device.

SUMMARY OF THE INVENTION

To achieve these and other objects, and in view of its purposes, the present invention provides a process for fabricating a fin device as the body for a FET. The process comprises the steps of forming a vertical semiconductor-on-insulator fin on a substrate with an oxide layer on top of a segment of the fin; depositing a polysilicon layer; forming a source and a drain separated by a polysilicon channel on top of the oxide layer that is on top of the segment of the fin; implanting dopants for workfunction adjustments; depositing a silicide layer over the exposed polysilicon layer; depositing an oxide layer over the fin; and polishing the oxide layer.

In another embodiment of the present invention, the process of fabricating the fin device results in a fully planarized device. In yet another embodiment of the present invention, the process of fabricating the fin device results in a source and drain separation in the range of approximately 10 nm. In still another embodiment of the present invention, the process of fabricating the fin device results in an oxide layer separating the fin from the polysilicon having a width approximately in the range of 1.5 nm.

The present invention also encompasses an improved fin device that is fully planarized. The device comprises a substrate, a vertical fin, a polysilicon deposition layer, an oxide layer on top of a segment of the fin and the exposed substrate, a source and drain formed on top of the oxide layer, a polysilicon gate separating the source and drain, dopant implants for work function adjustments, a silicide layer covering the polysilicon gate, and a top oxide layer forming a planarized top surface of the fin device. In another aspect of the present invention, the improved fin device has a separation between the source and drain in the range of approximately 10 nm. In yet another aspect of the present invention, the improved fin device has an oxide layer separating the fin from the polysilicon having a width approximately in the range of 1.5 nm.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of various features are arbitrarily expanded or reduced for clarity. Included in the drawing are the following figures:

FIG. 9A is a cross-sectional view showing the device of FIG. 8A after an eighth step in the process of making an exemplary embodiment of the fin device according to the present invention;

FIG. 9B is a cross-sectional view showing the device of FIG. 8B after the eighth step in the process of making an exemplary embodiment of the fin device according to the present invention;

FIG. 10A is a cross-sectional view showing the device of FIG. 9A after a ninth step in the process of making an exemplary embodiment of the fin device according to the present invention;

FIG. 10B is a cross-sectional view showing the device of FIG. 9B after the ninth step in the process of making an exemplary embodiment of the fin device according to the present invention;

FIG. 13A is a cross-sectional view showing the device of FIG. 12A after a twelfth step in the process of making an exemplary embodiment of the fin device according to the present invention;

FIG. 13B is a cross-sectional view showing the device of FIG. 12B after the twelfth step in the process of making an exemplary embodiment of the fin device according to the present invention;

FIG. 15A is the fin device manufactured in accordance with the present invention, taken along the cross section labeled 15A—15A in FIG. 13A; and FIG. 15B is a graph of electron concentration versus depth into the fin device as the fin device is shown in FIG. 15A.

DETAILED DESCRIPTION OF THE INVENTION

The invention will next be illustrated with reference to the figures in which the same numbers indicate the same elements in all figures. Such figures are intended to be illustrative, rather than limiting, and are included to facilitate the explanation of the process and device of the present invention.

The invention is an improved fin device used as the body of a FET and a process of making such a fin device. In an exemplary embodiment, the fin device is fully planarized, double gated, and is fabricated to allow ten or more devices to be placed within a one micrometer width. The invention also provides the process to fabricate such a small device. To best understand the sections and layers of the device, the process of fabricating the device is first described.

Figure 1:
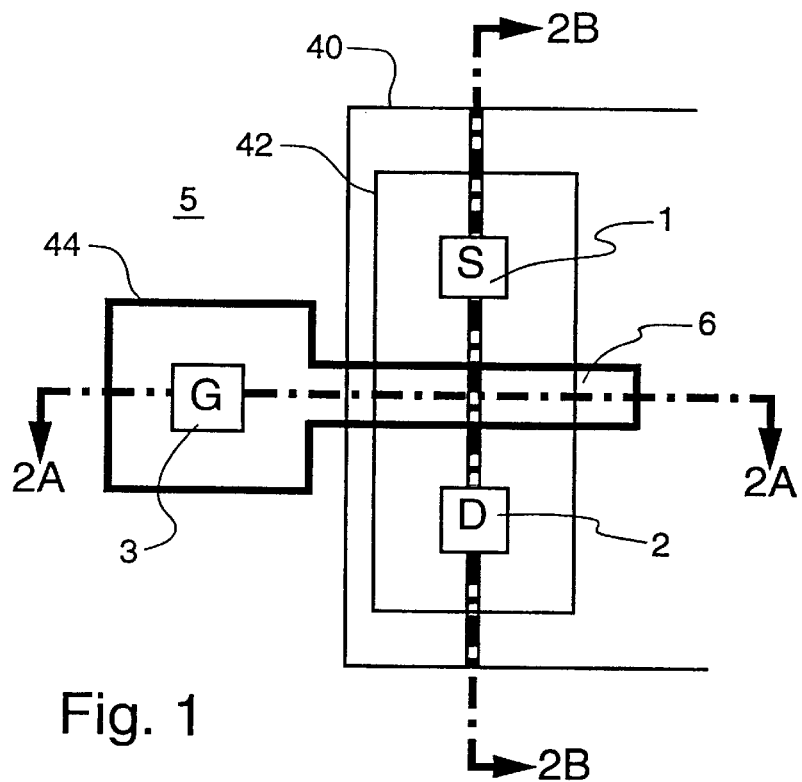
FIG. 1 illustrates a top view of an exemplary embodiment of the fin device according to the present invention showing the location of the cross-sectional views shown in FIGS. 2 through 13.

As shown in FIG. 1, the typical MOSFET as well as an exemplary embodiment of the present invention fin device each have a source 1 and drain 2 separated by a channel 6, all of which are formed on a substrate or buried oxide layer ("BOX") 5. Also shown in FIG. 1 is a gate 3 running perpendicular to the plane connecting the source 1 and drain 2. The gate 3 is fabricated from a conducting material such as, in a preferred embodiment, a polysilicon material. The gate 3 may also be manufactured of other conducting metals, however, such as aluminum.

FIG. 1 also illustrates several of the components used in the process of manufacturing the fin device. One of these components is the fin trim mask 40. Also illustrated are the mask 42 used to form the source 1 and the drain 2, and the mask 44 used to form the gate 3.

The general operation of a MOSFET is controlled by gate 3 produces an electric field in the channel 6. Due to its location, the electric field produced by the gate 3 is emitted into the channel 6 that separates source 1 and drain 2. By controlling the gate electric field, the current flow between source 1 and drain 2, and across channel 6, may be unimpeded or prevented.

To understand the inventive method of making an exemplary embodiment of the improved fin device 10 (see FIGS. 13A and 13B), cross-sectional views of the device during the fabrication process are shown. Two cross sectional views are shown for each step of the fabrication process. Cross sectional views labeled "A" in the figures, such as view 2A—2A shown in FIG. 1, are as observed through the gate 3 and centered across a line connecting source 1 and drain 2. Cross sectional views labeled "B" in the figures, such as view 2B—2B shown in FIG. 1, are as observed across the gate 3 and through a line connecting source 1 and drain 2.

The general process of fabricating a MOSFET has been practiced for many years. Due to the multitude of different ways of specifically fabricating a MOSFET, however, the particular order and specific steps in the process are critical to describe the fabrication process of a particular device. The alteration of one step in a fabrication process may result in a completely different MOSFET device. Accordingly, the process of fabricating the inventive fin device is described in detail with reference to the figures.

Figures 2A, 2B:
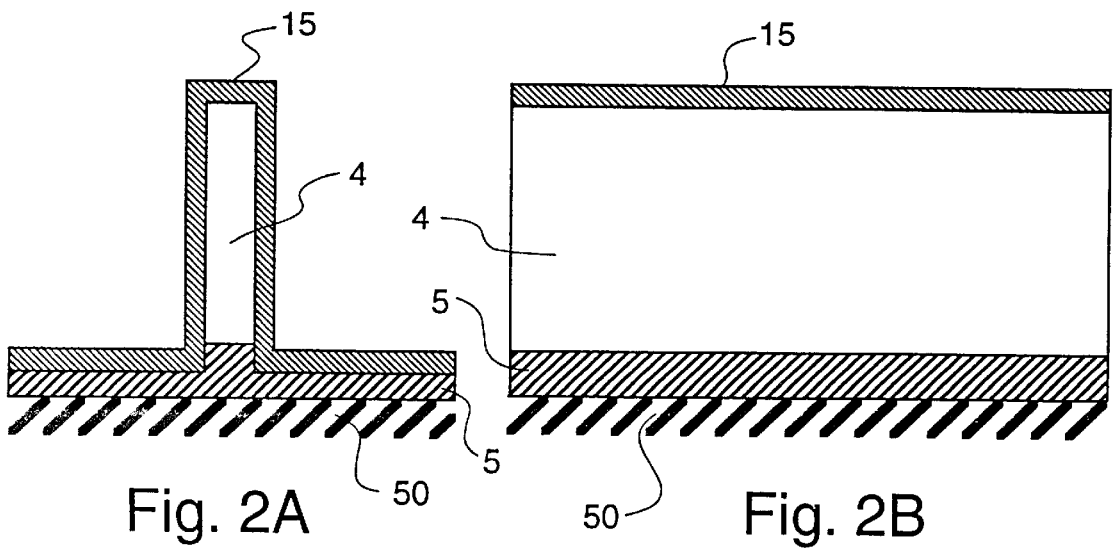
FIG. 2A is a cross-sectional view taken along the line 2A—2A of FIG. 1 after a first step in the process of making an exemplary embodiment of the fin device according to the present invention.
FIG. 2B is a cross-sectional view taken along the line 2B—2B of FIG. 1 after the first step in the process of making an exemplary embodiment of the fin device according to the present invention.

The first step in making an embodiment of the fin device 10 is the step of forming the silicon-on-insulator ("SOI") vertical fin 4 on the substrate or BOX 5, as shown in FIGS. 2A and 2B. The fin 4 may be formed by silicon dioxide spacer deposition. In another embodiment, the fin 4 may be formed by conventional chrome-less phase shift mask printing. Either technique provides the ability to form a vertical SOI fin 4 having a width in the range of approximately 10 nm. The fin 4 and substrate or BOX 5 are anisotropically etched and a nitride layer 15 is deposited over the fin 4 and the substrate or BOX 5. As shown in FIG. 2A, the substrate or BOX 5 is over etched to a level below the fin 4. In a preferred embodiment, the etching may be completed by reactive ion etching ("RIE"). The fin device 10 is generally built upon a substrate wafer 50.

Figure 3A:
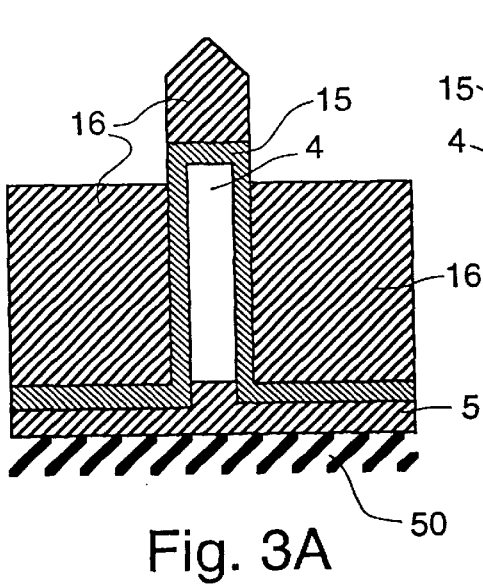
FIG. 3A is a cross-sectional view showing the device of FIG. 2A after a second step in the process of making an exemplary embodiment of the fin device according to the present invention.
Figure 3B:
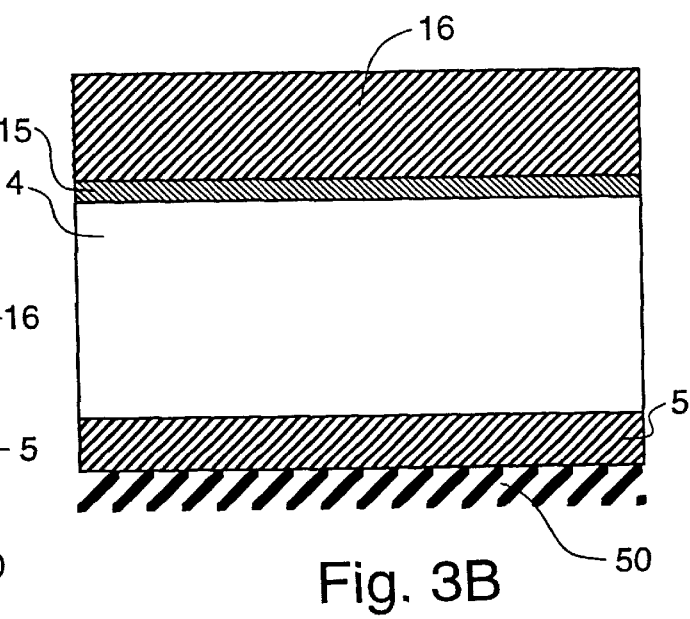
FIG. 3B is a cross-sectional view showing the device of FIG. 2B after the second step in the process of making an exemplary embodiment of the fin device according to the present invention.

An oxide layer 16 is next deposited over the nitride layer 15 as shown in FIGS. 3A and 3B. As shown, the top of the SOI fin 4 should extend higher than the periphery of the oxide layer 16. As described below, the thickness of the oxide layer 16 is used to set or adjust the desired height of the vertical SOI fin 4. In one preferred embodiment, the oxide layer 16 may be a high density plasma oxide.

Figure 4A:
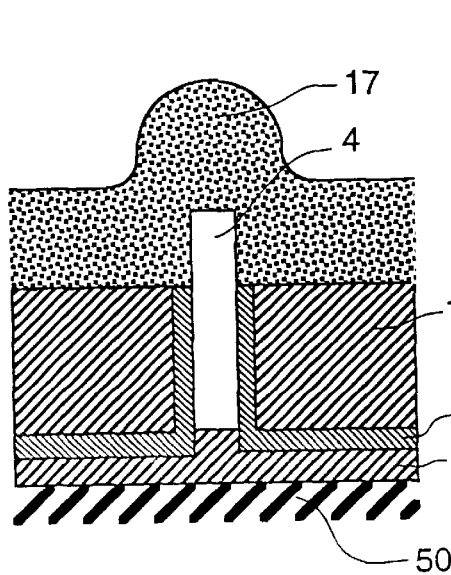
FIG. 4A is a cross-sectional view showing the device of FIG. 3A after a third step in the process of making an exemplary embodiment of the fin device according to the present invention.
Figure 4B:
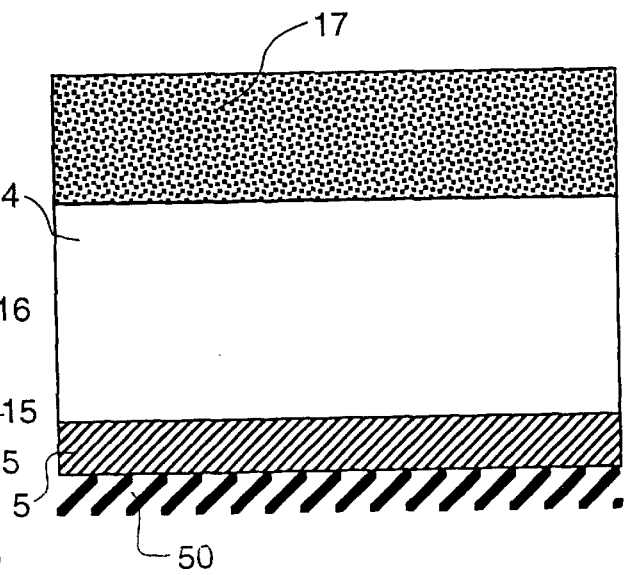
FIG. 4B is a cross-sectional view showing the device of FIG. 3B after the third step in the process of making an exemplary embodiment of the fin device according to the present invention.

In the next step, shown in FIGS. 4A and 4B, an oxide etching is used to remove the oxide layer 16 from the top of the fin 4 and to remove a portion of the oxide layer 16 from either side of the fin 4. A nitride etching is also completed to remove the nitride layer 15 from the top of the fin 4 and a portion of the nitride layer 15 on the sides of the fin 4. As also shown in FIGS. 4A and 4B, a polysilicon layer 17 is next deposited on tops of the oxide layer 16, the nitride layer 15, and the exposed fin 4.

Figures 5A, 5B:
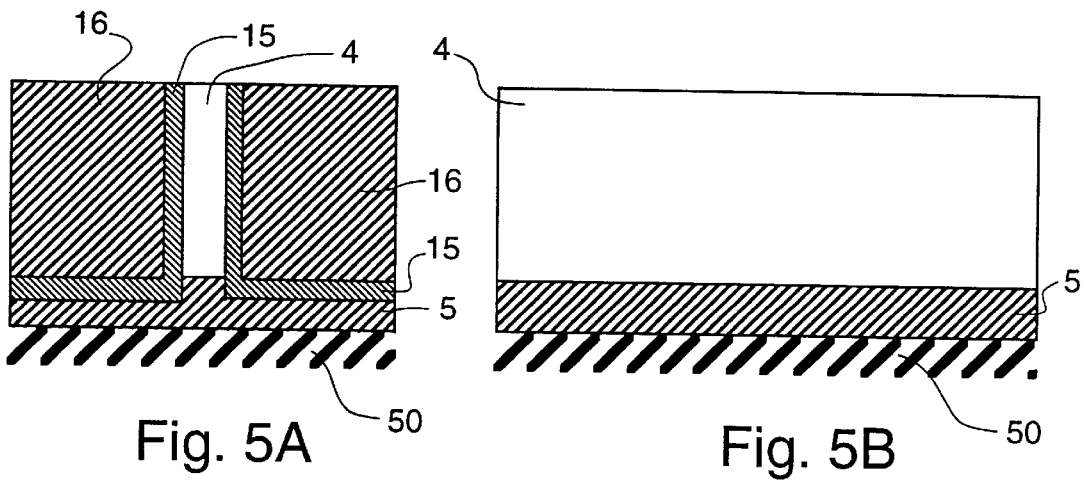
FIG. 5A is a cross-sectional view showing the device of FIG. 4A after a fourth step in the process of making an exemplary embodiment of the fin device according to the present invention.
FIG. 5B is a cross-sectional view showing the device of FIG. 4B after the fourth step in the process of making an exemplary embodiment of the fin device according to the present invention.
Figures 6A, 6B:
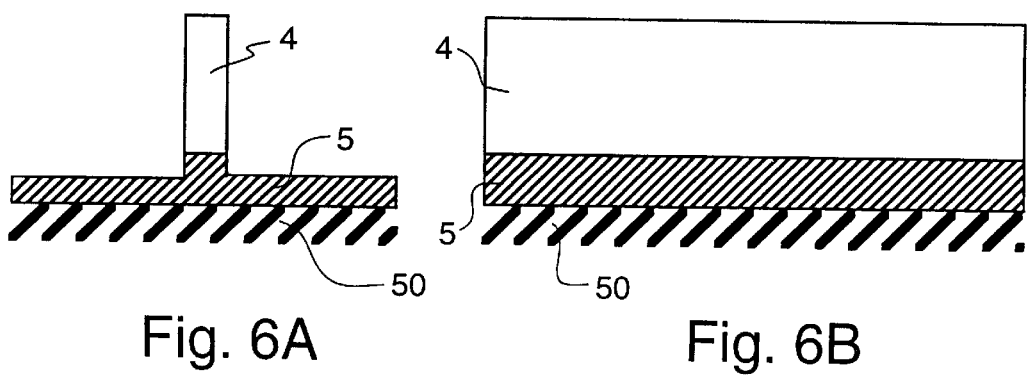
FIG. 6A is a cross-sectional view showing the device of FIG. 5A after a fifth step in the process of making an exemplary embodiment of the fin device according to the present invention.
FIG. 6B is a cross-sectional view showing the device of FIG. 5B after the fifth step in the process of making an exemplary embodiment of the fin device according to the present invention.

The height of the SOI fin 4 is next adjusted by polishing the polysilicon layer 17 and the SOI fin 4 as shown in FIGS. 5A and 5B. In a preferred embodiment, the polishing technique may be the well-known chemical mechanical polishing ("CMP") process. The fin 4 is next completely exposed by removal of the oxide layer 16 and the nitride layer 15 as shown in FIGS. 6A and 6B. The process of removing the oxide layer 16 and the nitride layer 15 may be, in a preferred embodiment, by a wet chemical crystallographic orientation etch or, in another preferred embodiment, by a resist mask and etch.

Figures 7A, 7B:
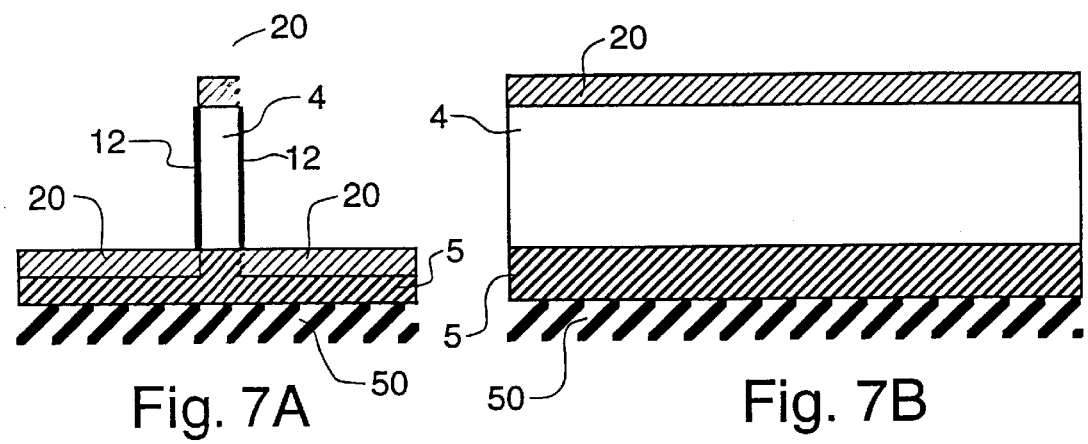
FIG. 7A is a cross-sectional view showing the device of FIG. 6A after a sixth step in the process of making an exemplary embodiment of the fin device according to the present invention.
FIG. 7B is a cross-sectional view showing the device of FIG. 6B after the sixth step in the process of making an exemplary embodiment of the fin device according to the present invention.
Figures 8A, 8B:
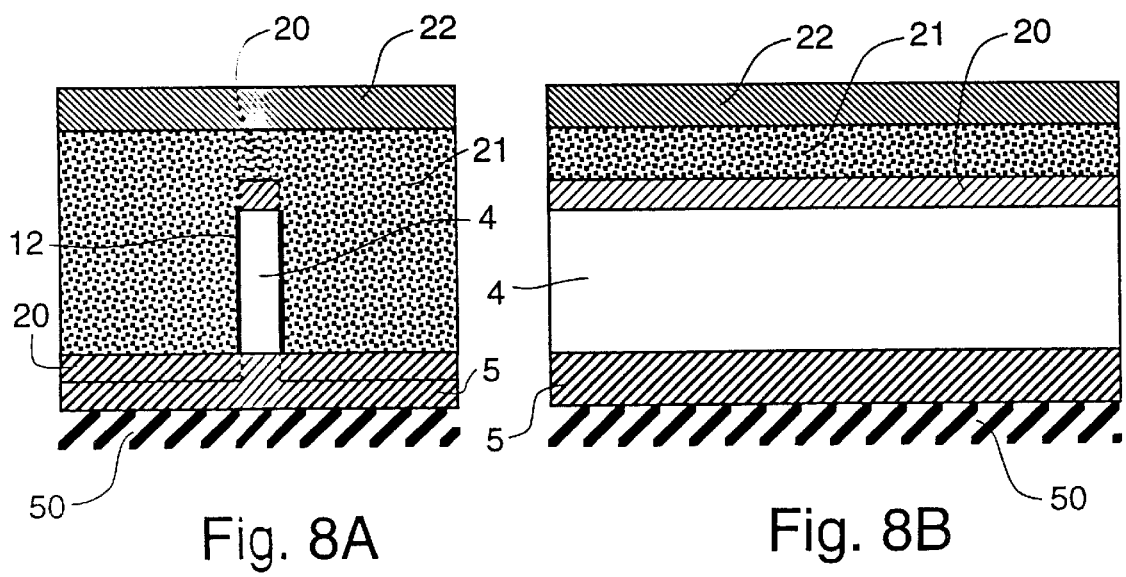
FIG. 8A is a cross-sectional view showing the device of FIG. 7A after a seventh step in the process of making an exemplary embodiment of the fin device according to the present invention.
FIG. 8B is a cross-sectional view showing the device of FIG. 7B after the seventh step in the process of making an exemplary embodiment of the fin device according to the present invention.

As shown in FIGS. 7A and 7B, the next step is incorporating the channel implants on either side of the SOI fin 4 and then depositing a new oxide material. The oxide material forms an oxide layer 20 on top of the substrate or BOX 5 and on top of the fin 4, and forms thin oxide layers 12 on either side of the fin 4. Similar to the above steps, in a preferred embodiment, the oxide used in this step may be a high density plasma oxide. A new polysilicon layer 21 is next deposited over the oxide layer 20 and around the fin 4 to a level above the height of the fin 4 and oxide layer 20, as shown in FIGS. 8A and 8B. A new nitride layer 22 is next deposited on top of the polysilicon layer 21.

The halo or pocket doping is next implanted into the fin 4. As shown in FIGS. 9A and 9B, the polysilicon layer 21 and the nitride layer 22 are selectively removed such that a segment of the polysilicon layer 21 and the nitride layer 22 remain over the fin 4. In a preferred embodiment, the selective removal may be accomplished by conventional lithography and RIE. The etching may be selective to thick polysilicon to provide more effective removal of the polysilicon layer 21 located on either side of the fin 4. The length of the halo or polysilicon layer 21 remaining on top of the fin 4 is determined by the lithography selected. Thus if a wide lithography is selected, the polysilicon length will be correspondingly large. Similarly, a narrow lithography line will result in a smaller polysilicon length, and as discussed below, a smaller channel length between the source 1 and drain 2.

Figure 14:
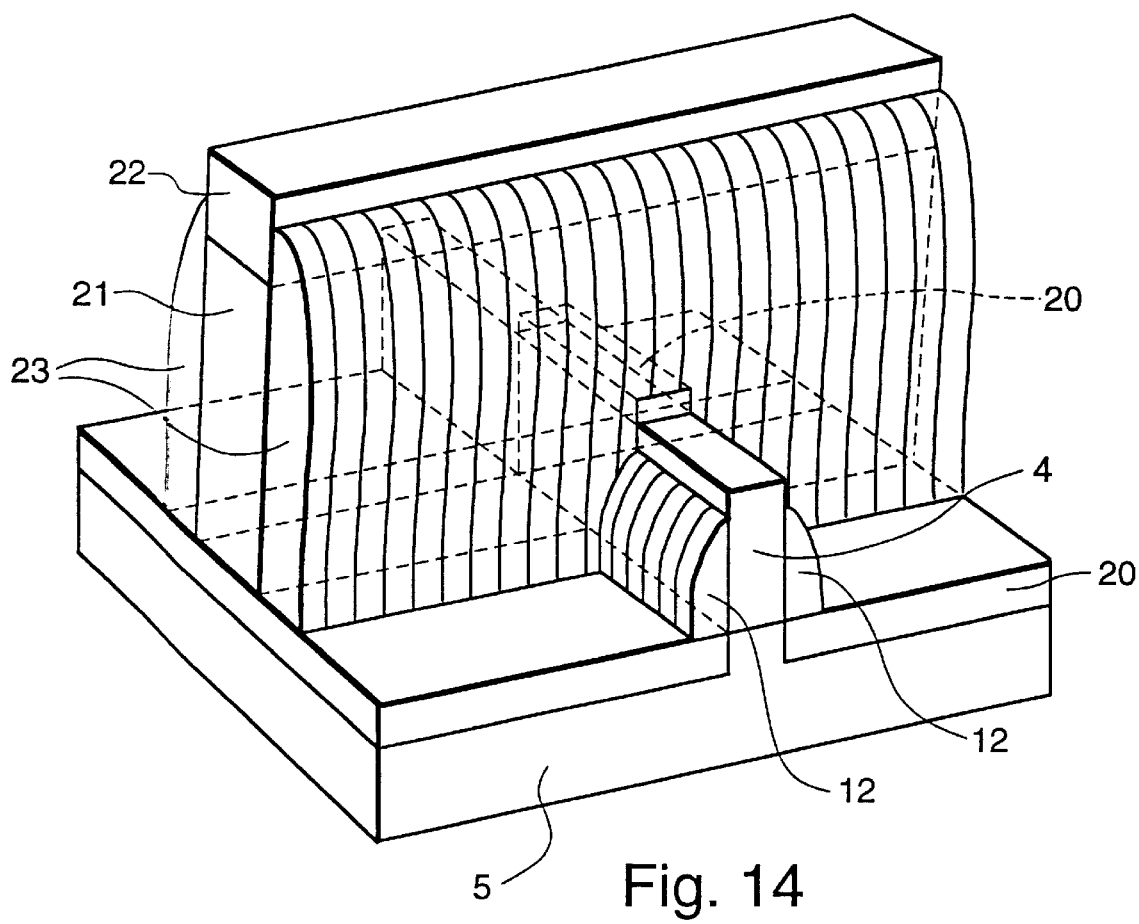
FIG. 14 is a perspective view of an exemplary embodiment of the fin device of the present invention being fabricated and as shown in the cross-sectional views of FIGS. 10A and 10B.

In the next step, as shown in FIGS. 10A and 10B, the source and drain spacers 23 are incorporated on top of the oxide layer 20 and on either side of the halo polysilicon layer 21. Also shown in FIGS. 10A and 10B, the exposed oxide layer 20 on top of the fin 4 is then removed by an etching process to the stop layer (the top of the SOI fin 4) A perspective view of the fin device after these fabrication steps is shown in FIG. 14. As shown in FIG. 14, the vertical SOI fin 4 is the shorter of the two vertical elements. The taller element illustrates the haloformation or polysilicon gate formation on top of the SOI fin 4, including the oxide layer 20, the nitride source and drain spacers 23 on either side of the polysilicon layer 21, and the nitride layer 22 on top of the polysilicon layer 21.

Figures 11A, 11B:
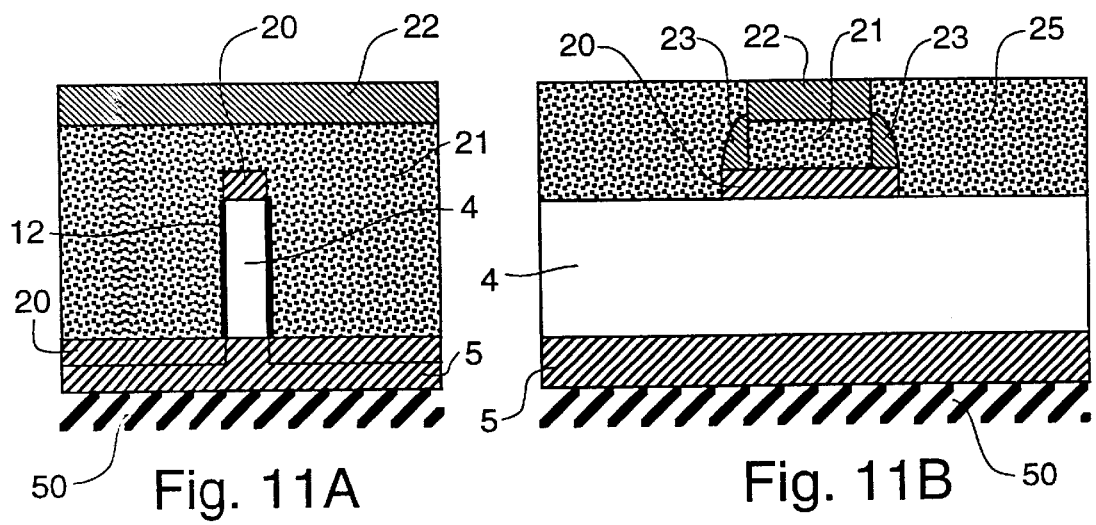
FIG. 11A is a cross-sectional view showing the device of FIG. 10A after a tenth step in the process of making an exemplary embodiment of the fin device according to the present invention.
FIG. 11B is a cross-sectional view showing the device of FIG. 10B after the tenth step in the process of making an exemplary embodiment of the fin device according to the present invention.

A thick polysilicon layer 25 is next deposited on top of the fin 4 and the halo or polysilicon gate formed on top of the SOI fin 4. Through a polishing process, which in a preferred embodiment may be CMP, the polysilicon layer 25 is partially removed and the fin device is planarized to the level of the nitride layer 22 separating the source and drain implants 23. The structure that results after these two steps of the process of the present invention is shown in FIGS. 11A and 11B.

Figures 12A, 12B:
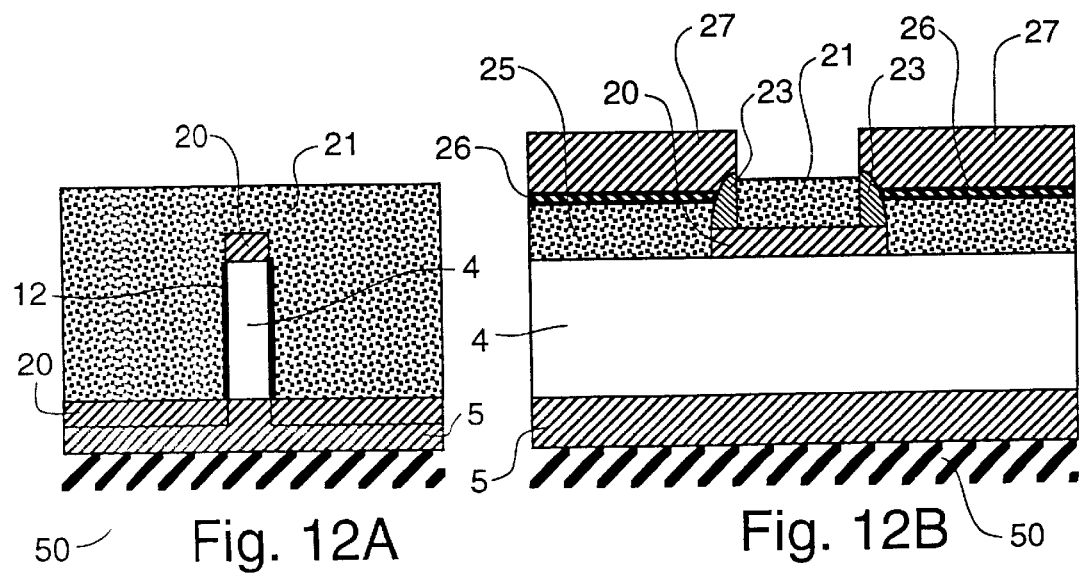
FIG. 12A is a cross-sectional view showing the device of FIG. 11A after a eleventh step in the process of making an exemplary embodiment of the fin device according to the present invention.
FIG. 12B is a cross-sectional view showing the device of FIG. 11B after the eleventh step in the process of making an exemplary embodiment of the fin device according to the present invention.

The thick polysilicon layer 25 is next etched to a level below the top of the nitride source and drain implants 23 and a thin silicide layer 26 is formed over the polysilicon layer 25 on either side of the halo as shown in FIG. 12B. In a preferred embodiment, the silicide layer 26 may be a cobalt silicide. Titanium silicide may also be used and exhibits similar resistivity to cobalt silicide. A new oxide layer 27 is next deposited over the silicide layer 26 and the oxide layer 27 is again polished to a level of the nitride layer 22 for planarization of the device. Finally, as shown in FIGS. 12A and 12B, the nitride layer 22 is etched away to the polysilicon layer 21. The etching process may be RIE that is selective to polysilicon as located between the source and drain implants 23.

As shown in FIGS. 13A and 13B, the fin device 10 is completed. The steps to fabricate the completed device include, first, to implant dopants or channel elements 11 for workfunction adjustments. In a preferred embodiment the implanted elements or dopants may be selected to permit dual workfunction adjustments for both p-type and n-type devices. Second, a new silicide layer 28 is formed on the exposed polysilicon layer 21 between the nitride source and drain spacers 23. Again, although in a preferred embodiment the silicide layer 28 may be cobalt-silicide, in another embodiment titanium silicide may also be used. A new oxide layer 29 is provided over the silicide layers 26 and 28. The device surface is polished to create a fully planarized fin device 10. Lastly, the contacts (not shown) necessary for electrical connections to the device 10 are formed.

The cross-sectional views of FIGS. 13A and 13B show the elements and layers of the improved fin device 10. More specifically, the device 10 is formed on a buried oxide layer 5. The buried oxide layer or BOX 5 is placed on a wafer substrate 50 to facilitate the manufacturing process. The BOX 5 is partially etched or cut back and filled with an oxide layer 20 as shown in FIG. 13A. On top of the substrate or BOX 5 is the vertical SOI fin 4, and on top of a segment of the fin 4 is a thin oxide layer 20 which electrically isolates the gate from the top of the fin. On both sides of the fin 4 are thin oxide layers 12. Surrounding the fin 4 and covering the substrate or BOX 5 is a thick polysilicon layer 21.

On top of the oxide layer 20, which is positioned on the top of a portion of the fin 4, are two nitride source and drain implants 23. The two nitride source and drain spacers 23 are separated by a polysilicon layer 21. The polysilicon layer 21 separating the nitride source and drain spacers 23 is coated with a thin silicide layer 28. Similar to the above described final fabrication steps, prior to applying the silicide layer 28, dopants or channel elements 11 implanted for workfunction adjustments. As also noted above, in a preferred embodiment, the implanted dopants may be selected for dual workfunction adjustments for p-type or n-type devices on either side of the polysilicon gate is coated with a thin silicide layer 26. The silicide that forms silicide layers 26 and 28 may be, in a preferred embodiment, a cobalt silicide. As described above, however, titanium silicide may also be used. Oxide layers 27 and 29 form the top layer of the fin device 10. As described above, after the final oxide layers 27 and 29 are fabricated as part of the fin device 10, the top is polished to create a fully planarized device as shown in FIGS. 13A and 13B. The polishing or planarizing of the fin device 10 may be accomplished by a CMP technique.

A specific cross-section of the fin device 10 manufactured in accordance with the present invention is illustrated in FIG. 15A. One aspect of the performance of the improved fin device 10 is shown in the FIG. 15B graph of electron concentration versus penetration or depth into the cross section of the vertical fin device. The exemplary fin device shown has a 10 nm thick fin 4 and a 1.5 nm thick oxide layer 12 on either side of the fin 4. The calculated data shown in FIG. 15B are for the threshold voltage as well as four increasing levels of threshold voltages each differing by 50 mV. Both the standard classical equation results (the diamond data points) and quantum mechanic ("QM") analysis results (the "plus" data points) are shown. It is believed that the QM data are more representative of the characteristics of devices having dimensions in the nanometer range.

For the lower three threshold voltage levels, the electron concentration essentially increases from zero to a plateau level as depth into the gate oxide and silicon fin increases. For the larger two threshold voltages, the electron concentration sharply peaks at or near the gate oxide and then quickly drops to a lower level near the middle of the silicon fin.

Simulation results also show that the fin device, having a fin thickness of 10 nm, exhibits a subthreshold voltage slope of approximately 60 to 62 mV/decade as compared to the standard classical results which show a slope of 88 mV/decade. The QM analysis results show a slope of 92 mV/decade. Therefore, the fin device of the present invention has a steeper subthreshold voltage slope and will exhibit a higher pinch-off voltage and an accordingly higher saturation on-current as compared to devices having characteristics described by the classical and QM analyses.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A process for fabricating a fin device, comprising the steps of:
   (a) depositing a dielectric on a substrate;
   (b) etching the dielectric to form a vertical fin;
   (c) sequentially depositing a nitride composition layer and an oxide composition layer;
   (d) etching the oxide layer to expose a section of the fin;
   (e) etching the nitride layer from the exposed section of the fin;
   (f) depositing a polysilicon layer;
   (g) polishing the polysilicon layer and fin to a selected fin height;
   (h) removing the oxide layer and the nitride layer;
   (i) depositing an oxide layer;
   (j) implanting dual channel elements;
   (k) depositing a polysilicon layer and a nitride layer;
   (l) etching selectively the nitride layer and polysilicon layer to form a spacer over the fin;
   (m) implanting source and drain dopants into the fin exposed surfaces;
   (n) etching the oxide layer;
   (o) depositing a polysilicon layer;
   (p) polishing the polysilicon layer to planarize the polysilicon layer with nitride layer;
   (q) etching the polysilicon layer;
   (r) depositing sequentially a silicide layer and an oxide layer;
   (s) polishing the oxide layer to planarize the oxide layer and nitride layer;
   (t) etching the nitride layer to expose the polysilicon layer between the source and drain;
   (u) implanting dopants for workfunction adjustments;
   (v) forming a silicide layer between the source and drain;
   (w) depositing an oxide layer;
   (x) polishing the oxide layer to form a planar surface; and
   (y) forming dual contacts in the device.

2. The process of fabricating a fin device of claim 1, wherein the etching process in steps (b), (d), (e), (n), (q), and (t) is reactive ion etching.

3. The process of fabricating a fin device of claim 1, wherein the polishing process in steps (g), (p), (s), and (x) is chemical mechanical polishing.

4. The process of fabricating a fin device of claim 1, wherein the oxide deposition layer in steps (c), (i), (r), and (w) is a high density plasma oxide.

5. The process of fabricating a fin device of claim 1, wherein the resulting fin device is fully planarized.

6. The process of fabricating a fin device of claim 1, wherein the resulting fin device is adapted to be packaged to provide at least ten devices within approximately a one micrometer width.

7. The process of fabricating a fin device of claim 1, wherein the separation between the source and drain is approximately 10 nm.

8. The process of fabricating a fin device of claim 1, wherein the oxide separating the fin from the polysilicon has a width of approximately 1.5 nm.

9. The process of fabricating a fin device of claim 1, wherein the source and drain are formed from silicon nitride.

10. The process of fabricating a fin device of claim 1, wherein the fin is an anisotropically etched semiconductor-on-insulator.

11. The process of fabricating a fin device of claim 1, wherein the halo formed in step (l) is formed by lithography.

12. A process for fabricating a fin device as the body for a field effect transistor, comprising the steps of:
   (a) forming a vertical semiconductor-on-insulator fin on a substrate with an oxide layer on top of a segment of said fin;
   (b) depositing a polysilicon layer;
   (c) forming a source and a drain separated by a polysilicon channel on top of the oxide layer that is on top of the segment of the fin;
   (d) implanting dopants for workfunction adjustments;
   (e) depositing a silicide layer over the exposed polysilicon layer;
   (f) depositing an oxide layer over the fin; and
   (g) polishing the oxide layer.

13. The process of fabricating a fin device of claim 12, further comprising the step of polishing the top of the device to create a fully planarized fin device.

14. The process of fabricating a fin device of claim 12, wherein the resulting fin device is adapted to be packaged to provide at least ten devices within approximately a one micrometer width.

15. The process of fabricating a fin device of claim 12, wherein the separation of the source and drain is approximately 10 nm.

16. The process of fabricating a fin device of claim 12, wherein the source and drain are formed from silicon nitride.

17. The process of fabricating a fin device of claim 12, wherein the fin device is an anisotropically etched semiconductor-on-insulator.

18. The process of fabricating a fin device of claim 12, wherein the polishing process in step (g) is chemical mechanical polishing.

19. The process of fabricating a fin device of claim 12, wherein the oxide deposition layer in steps (a) and (f) is a high density plasma oxide.

* * * * *